(12) United States Patent
Kang et al.

(10) Patent No.: US 12,489,000 B2
(45) Date of Patent: Dec. 2, 2025

(54) APPARATUS FOR TREATING SUBSTRATE AND METHOD FOR TREATING SUBSTRATE

(71) Applicant: SEMES CO., LTD., Chungcheongnam-do (KR)

(72) Inventors: Min Ok Kang, Daejeon (KR); Young Il Lee, Chungcheongnam-do (KR); Kyu Hwan Chang, Chungcheongnam-do (KR)

(73) Assignee: SEMES CO., LTD., Cheonan-si (KR)

( * ) Notice: Subject to any disclaimer, the term of this patent is extended or adjusted under 35 U.S.C. 154(b) by 786 days.

(21) Appl. No.: 17/565,331

(22) Filed: Dec. 29, 2021

(65) Prior Publication Data

US 2022/0208560 A1   Jun. 30, 2022

(30) Foreign Application Priority Data

Dec. 31, 2020 (KR) .................. 10-2020-0189425

(51) Int. Cl.
*H01L 21/67* (2006.01)

(52) U.S. Cl.
CPC .... *H01L 21/6708* (2013.01); *H01L 21/67051* (2013.01)

(58) Field of Classification Search
CPC .......... H01L 21/6708; H01L 21/67051; H01L 21/67017; H01L 21/67248; H01L 21/68792; H01L 21/02164; H01L 21/0217; H01L 21/31111; H01L 21/68764; B05C 11/1042
USPC ..................................................... 134/99.1
See application file for complete search history.

(56) References Cited

U.S. PATENT DOCUMENTS

| | | | |
|---|---|---|---|
| 8,793,898 B2 * | 8/2014 | Jeong | ................ H01L 21/67051 134/32 |
| 10,002,770 B2 | 6/2018 | Izumoto et al. | |
| 11,217,452 B2 | 1/2022 | Izumoto et al. | |
| 2009/0173364 A1 * | 7/2009 | Hamada | ............ H01L 21/67225 134/99.1 |

(Continued)

FOREIGN PATENT DOCUMENTS

| | | |
|---|---|---|
| CN | 107924832 A | 4/2018 |
| JP | 2014038949 A * | 2/2014 |

(Continued)

OTHER PUBLICATIONS

Machine translation of JP-2014038949-A (Year: 2014).*
Machine translation of KR-20190037689-A (Year: 2019).*

*Primary Examiner* — Michael E Barr
*Assistant Examiner* — Thomas Bucci
(74) *Attorney, Agent, or Firm* — Procopio, Cory, Hargreaves & Savitch LLP

(57) ABSTRACT

Provided is an apparatus for treating a substrate. In the exemplary embodiment, the apparatus for treating the substrate includes a support member configured to support a substrate and provided rotatably; a treating liquid nozzle configured to supply selectively a high-temperature first treating liquid and a high-temperature second treating liquid onto the substrate; and a controller configured to control the treating liquid nozzle so that the treating liquid nozzle first supplies the first treating liquid onto the substrate and then supplies the second treating liquid onto the substrate.

14 Claims, 4 Drawing Sheets

(56) References Cited

U.S. PATENT DOCUMENTS

| | | | |
|---|---|---|---|
| 2013/0318815 A1* | 12/2013 | Kim | B08B 7/0021 |
| | | | 34/487 |
| 2014/0051258 A1* | 2/2014 | Izumoto | H01L 21/67086 |
| | | | 156/345.23 |
| 2014/0051259 A1* | 2/2014 | Shibayama | H01L 21/68792 |
| | | | 156/345.23 |
| 2014/0090669 A1* | 4/2014 | Hinode | H01L 21/30604 |
| | | | 134/105 |
| 2014/0228989 A1 | 8/2014 | Tagliabue | |
| 2016/0049308 A1* | 2/2016 | Hinode | H01L 21/31111 |
| | | | 216/93 |
| 2018/0254190 A1 | 9/2018 | Izumoto et al. | |
| 2019/0131144 A1* | 5/2019 | Iwahata | B08B 3/14 |
| 2020/0303201 A1* | 9/2020 | Izumoto | H01L 21/0209 |

FOREIGN PATENT DOCUMENTS

| | | | | | |
|---|---|---|---|---|---|
| JP | 2014072389 A | 4/2014 | | | |
| JP | 2016042503 A | 3/2016 | | | |
| JP | 5996329 B2 | 9/2016 | | | |
| JP | 6046417 B2 | 12/2016 | | | |
| JP | 63233564 B2 | 11/2017 | | | |
| JP | 2018107455 A | 7/2018 | | | |
| JP | 2019129196 A | 8/2019 | | | |
| JP | 2020088003 A | 6/2020 | | | |
| KR | 20130015638 A | * | 2/2013 | ....... | H01L 21/67051 |
| KR | 1020130015637 A | | 2/2013 | | |
| KR | 1020130015638 A | | 2/2013 | | |
| KR | 1020140023212 A | | 2/2014 | | |
| KR | 1020150047068 A | | 5/2015 | | |
| KR | 101671118 B1 | | 10/2016 | | |
| KR | 20190037689 A | * | 4/2019 | ....... | H01L 21/02052 |
| KR | 1020190037689 A | | 4/2019 | | |
| TW | 201539570 A | | 10/2015 | | |
| TW | I576938 B | | 4/2017 | | |
| TW | 201840372 A | | 11/2018 | | |
| WO | 2012013583 A1 | | 2/2012 | | |
| WO | 2019187472 A1 | | 10/2019 | | |

* cited by examiner

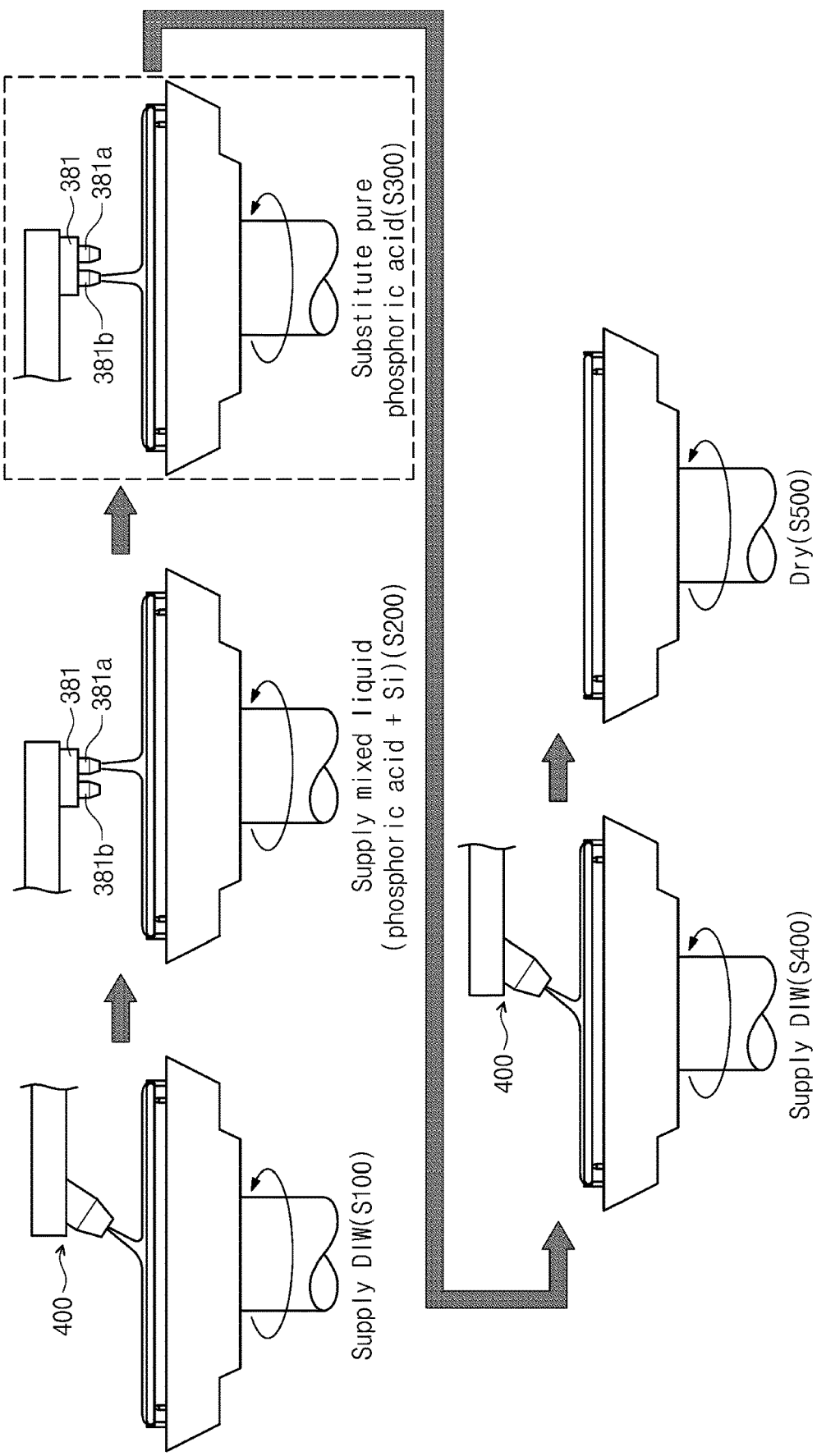

APPARATUS FOR TREATING SUBSTRATE AND METHOD FOR TREATING SUBSTRATE

CROSS-REFERENCE TO RELATED APPLICATIONS

This application claims priority to and the benefit of the Korean Patent Application No. 10-2020-0189425 filed in the Korean Intellectual Property Office on Dec. 31, 2020, the entire contents of which are incorporated herein by reference.

TECHNICAL FIELD

The present invention relates to an apparatus for treating a substrate and a method for treating a substrate.

BACKGROUND ART

In order to manufacture a semiconductor device or a liquid crystal display, various processes such as photolithography, etching, ashing, ion implantation, thin film deposition, cleaning, and the like are performed on a substrate. Among them, the etching process is a process of removing unnecessary regions of a thin film formed on the substrate, and high selectivity and a high etch rate for the thin film are required.

Generally, the etching process or the cleaning process of the substrate is largely performed by a chemical treating step, a rinse treating step, and a drying step in sequence. In the chemical treating step, a chemical for etching the thin film formed on the substrate or removing foreign matters on the substrate is supplied to the substrate, and in the rinse treating step, a rinse liquid such as deionized water is supplied onto the substrate.

SUMMARY OF THE INVENTION

The present invention has been made in an effort to provide a substrate treating apparatus and a substrate treating method capable of efficiently treating a substrate.

The present invention has been also made in an effort to provide a substrate treating apparatus and a substrate treating method capable of treating a substrate with high selectivity.

The present invention has been also made in an effort to provide a substrate treating apparatus and a substrate treating method capable of solving interference between nozzles by minimizing the nozzles in the substrate treating apparatus capable of treating the substrate with high selectivity.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate. In the exemplary embodiment, the apparatus for treating the substrate includes a support member configured to support a substrate and provided rotatably; a treating liquid nozzle configured to supply selectively a high-temperature first treating liquid and a high-temperature second treating liquid onto the substrate; and a controller configured to control the treating liquid nozzle so that the treating liquid nozzle first supplies the first treating liquid onto the substrate and then supplies the second treating liquid onto the substrate.

In the exemplary embodiment, the substrate may be provided in a state where a silicon nitride layer and a silicon oxide layer are formed.

In the exemplary embodiment, the first treating liquid may be provided with a mixed liquid of phosphoric acid and silicon.

In the exemplary embodiment, the second treating liquid may be provided with pure phosphoric acid.

In the exemplary embodiment, the apparatus for treating the substrate may include a first treating liquid tank configured to store the first treating liquid; a second treating liquid tank configured to store the second treating liquid; a first liquid supply pipe configured to transfer the first treating liquid stored in the first treating liquid tank to the treating liquid nozzle by connecting the first treating liquid tank and the treating liquid nozzle; and a second liquid supply pipe configured to transfer the second treating liquid stored in the second treating liquid tank to the treating liquid nozzle by connecting the second treating liquid tank and the treating liquid nozzle, wherein the first liquid supply pipe and the second liquid supply pipe may be provided so that one region or more are in contact with each other.

In the exemplary embodiment, the first liquid supply pipe and the second liquid supply pipe may be provided so as to be in contact with the treating liquid nozzle at one point.

In the exemplary embodiment, the first liquid supply pipe may include a first upstream pipe disposed upstream and connected with the first treating liquid tank and a first downstream pipe disposed downstream and connected with the treating liquid nozzle, based on the flow of the first treating liquid supplied to the treating liquid nozzle from the first treating liquid tank, and the second liquid supply pipe may include a second upstream pipe disposed upstream and connected with the second treating liquid tank and a second downstream pipe disposed downstream and connected with the treating liquid nozzle, based on the flow of the second treating liquid supplied to the treating liquid nozzle from the second treating liquid tank, wherein the first downstream pipe and the second downstream pipe may be provided to be in contact with each other.

In the exemplary embodiment, the first upstream pipe may be provided with a first heater and a valve, and the second upstream pipe may be provided with a second heater and a valve.

In the exemplary embodiment, the first heater may heat the first treating liquid at a high temperature, and the second heater may heat the second treating liquid at a high temperature.

In the exemplary embodiment, the first heater may heat the first treating liquid at 160° C. or higher, and the second heater may heat the second treating liquid at 160° C. or higher.

In the exemplary embodiment, the treating liquid nozzle may include a first nozzle portion and a second nozzle portion, wherein the first nozzle portion may be connected with the first liquid supply pipe, and the second nozzle portion may be connected with the second liquid supply pipe.

In the exemplary embodiment, the apparatus for treating the substrate may further include a DIW nozzle configured to supply deionized water onto the substrate.

In the exemplary embodiment, the controller may control a pre-wet process of supplying the deionized water onto the substrate for a predetermined time while the substrate is rotated; and an etching process of supplying sequentially the first treating liquid and the second treating liquid onto the substrate while the substrate is rotated to be performed after the pre-wet process.

In the exemplary embodiment, the controller may control a rinse process of supplying the deionized water onto the substrate to be performed after the etching process.

An exemplary embodiment of the present invention provides a method of etching the substrate provided in a state where a silicon nitride layer and a silicon oxide layer are formed. In the exemplary embodiment, the method for treating a substrate may perform an etching process on the substrate by first supplying a high-temperature first treating liquid onto the substrate and then supplying a high-temperature second treating liquid onto the substrate while the substrate is rotated.

Another exemplary embodiment of the present invention provides a method for treating a substrate including performing an etching process on the substrate by immersing the substrate in the high-temperature first treating liquid for a predetermined time and then immersing the substrate in the high-temperature second treating liquid, in a method of etching the substrate provided in a state where a silicon nitride layer and a silicon oxide layer are formed.

In the exemplary embodiment, the first treating liquid may be provided with a mixed liquid of phosphoric acid and silicon.

In the exemplary embodiment, the second treating liquid may be provided with pure phosphoric acid.

In the exemplary embodiment, the first treating liquid and the second treating liquid may be supplied at 160° C. or higher.

In the exemplary embodiment, the method for treating the substrate may further include a pre-wet process of supplying deionized water onto the substrate for a predetermined time while the substrate is rotated before the etching process; and a rinse process of supplying the deionized water onto the substrate after the etching process.

Another exemplary embodiment of the present invention provides an apparatus for treating a substrate including a support member configured to support a substrate and provided rotatably; a treating liquid nozzle configured to supply selectively a high-temperature first treating liquid and a high-temperature second treating liquid onto the substrate; a first treating liquid tank configured to store a mixed liquid of phosphoric acid and silicon as the first treating liquid; a second treating liquid tank configured to store pure phosphoric acid as the second treating liquid; a first liquid supply pipe configured to transfer the first treating liquid stored in the first treating liquid tank to the treating liquid nozzle by connecting the first treating liquid tank and the treating liquid nozzle; and a second liquid supply pipe configured to transfer the second treating liquid stored in the second treating liquid tank to the treating liquid nozzle by connecting the second treating liquid tank and the treating liquid nozzle. The first liquid supply pipe may include a first upstream pipe disposed upstream, connected with the first treating liquid tank, and provided with a first heater and a valve, and a first downstream pipe disposed downstream and connected with the treating liquid nozzle, based on the flow of the first treating liquid supplied to the treating liquid nozzle from the first treating liquid tank, and the second liquid supply pipe may include a second upstream pipe disposed upstream, connected with the second treating liquid tank, and provided with a second heater and a valve and a second downstream pipe disposed downstream and connected with the treating liquid nozzle, based on the flow of the second treating liquid supplied to the treating liquid nozzle from the second treating liquid tank, wherein the first downstream pipe and the second downstream pipe may provided to be in contact with each other. The apparatus for treating the substrate may further include a controller configured to control the treating liquid nozzle so that the treating liquid nozzle first supplies the first treating liquid onto the substrate and then supplies the second treating liquid onto the substrate, wherein the substrate may be provided in a state where a silicon nitride layer and a silicon oxide layer are formed.

According to various exemplary embodiments of the present invention, it is possible to efficiently treat a substrate.

According to various exemplary embodiments of the present invention, it is possible to treat a substrate with high selectivity.

According to various exemplary embodiments of the present invention, it is possible to solve interference between nozzles by minimizing the nozzles in a substrate treating apparatus capable of treating the substrate with high selectivity.

The effect of the present invention is not limited to the foregoing effects, and non-mentioned effects will be clearly understood by those skilled in the art from the present specification and the accompanying drawings.

BRIEF DESCRIPTION OF THE DRAWINGS

FIG. 5 is a diagram illustrating a process of treating a substrate according to an exemplary embodiment of the present invention.

DETAILED DESCRIPTION

Figure 1:
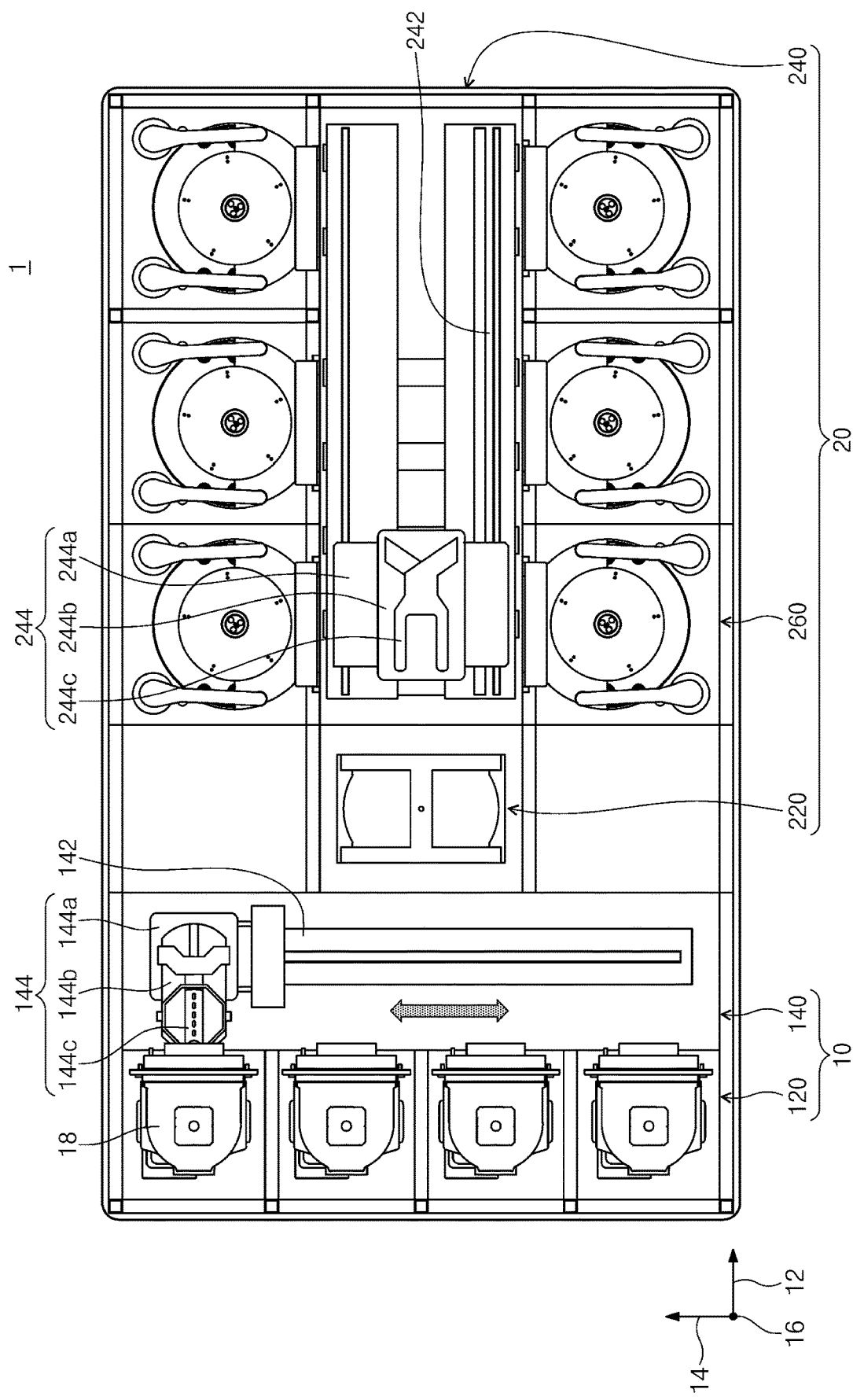
FIG. 1 is a plan view illustrating a substrate treating apparatus according to an exemplary embodiment of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "include" and variations such as "includes" or "including" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~", and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

FIG. 1 is a plan view illustrating a substrate treating apparatus according to an exemplary embodiment of the present invention.

Referring to FIG. 1, a substrate treating apparatus 1 has an index module 10 and a process treating module 20. The index module 10 has a load port 120 and a transfer frame 140. The load port 120, the transfer frame 140, and the process treating module 20 are sequentially arranged in a line. Hereinafter, a direction in which the load port 120, the transfer frame 140, and the process treating module 20 are arranged is referred to as a first direction 12, a direction vertical to the first direction 12 when viewed from the top is referred to as a second direction 14, and a direction vertical to a plane including the first direction 12 and the second direction 14 is referred to as a third direction 16.

A carrier 130 in which a substrate W is received is positioned in the load port 120. A plurality of load ports 120 are provided and arranged in a line along the second direction 14. The number of load ports 120 may be changed according to the process efficiency, the footprint conditions, and the like of the process treating module 20. A plurality of slots (not illustrated) is formed in the carrier 130 to receive the substrates W in a state of being disposed horizontally with the ground. The carrier 130 may be used with a front opening unified pod (FOUP).

The process treating module 20 has a buffer unit 220, a transfer chamber 240, and a process chamber 260. The transfer chamber 240 is disposed so that the longitudinal direction thereof is in parallel with the first direction 12. On both sides of the transfer chamber 240, the process chambers 260 are disposed. On one side and the other side of the transfer chamber 240, the process chambers 260 are provided to be symmetrical based on the transfer chamber 240. On one side of the transfer chamber 240, a plurality of process chambers 260 is provided. Some of the process chambers 260 are disposed along the longitudinal direction of the transfer chamber 240. Further, some of the process chambers 260 are disposed to be stacked with each other. That is, on one side of the transfer chamber 240, the process chambers 260 may be disposed in an array of A×B. Here, A represents the number of process chambers 260 provided along the first direction 12 in a line, and B represents the number of process chambers 260 provided along the third direction 16 in a line. When 4 or 6 process chambers 260 are provided on one side of the transfer chamber 240, the process chambers 260 may be disposed in an array of 2×2 or 3×2. The number of process chambers 260 may be changed. Unlike described above, the process chamber 260 may be provided only on one side of the transfer chamber 240. Further, the process chamber 260 may be provided on one side and both sides of the transfer chamber 240 in a single layer.

The buffer unit 220 is disposed between the transfer frame 140 and the transfer chamber 240. The buffer unit 220 provides a space in which the substrate W is left before the substrate W is transferred between the transfer chamber 240 and the transfer frame 140. Slots (not illustrated) on which the substrate W is placed are provided inside the buffer unit 220. A plurality of slots (not illustrated) is provided to be spaced apart from each other along the third direction 16. The buffer unit 220 is opened with a surface facing the transfer frame 140 and a surface facing the transfer chamber 240.

The transfer frame 140 transfers the substrate W between the carrier 130 seated on the load port 120 and the buffer unit 220. The transfer frame 140 is provided with an index rail 142 and an index robot 144. The index rail 142 is provided so that the longitudinal direction thereof is in parallel with the second direction 14. The index robot 144 is provided on the index rail 142 and is moved linearly in the second direction 14 along the index rail 142. The index robot 144 has a base 144a, a body 144b, and an index arm 141c. The base 144a is provided to be movable along the index rail 142. The body 144b is coupled to the base 144a. The body 144b is provided to be movable along the third direction 16 on the base 144a. In addition, the body 144b is provided to be rotatable on the base 144a. The index arm 144c is coupled to the body 144b and is provided to move forward and backward with respect to the body 144b. A plurality of index arms 144c is provided to be individually driven. The index arms 144c are disposed to be stacked while being spaced apart from each other along the third direction 16. Some of the index arms Mc may be used when the substrate W is transferred from the process treating module 20 to the carrier 130 and others thereof may be used when the substrate W is transferred from the carrier 130 to the process treating module 20. As a result, the index robot 111 may prevent particles generated from the substrate W before the process treatment from being attached to the substrate W after the process treatment, in the process of carrying in and out the substrate W.

The transfer chamber 240 transfers the substrate W between the buffer unit 220 and the process chamber 260 and between the process chambers 260. The transfer frame 240 is provided with a guide rail 242 and a main robot 244. The guide rail 242 is disposed so that the longitudinal direction thereof is in parallel with the first direction 12. The main robot 244 is provided on the guide rail 242 and is moved linearly along the first direction 12 on the guide rail 242. The main robot 244 has a base 244a, a body 244b, and a main arm 244c. The base 244a is provided to be movable along the guide rail 242. The body 244b is coupled to the base 244a. The body 244b is provided to be movable along the third direction 16 on the base 244a. In addition, the body 244b is provided to be rotatable on the base 244a. The main arm 244c is coupled to the body 244b and is provided to move forward and backward with respect to the body 244b. A plurality of main arms 244c is provided to be individually driven. The main arms 244c are disposed to be stacked while being spaced apart from each other along the third direction 16.

The process chamber 260 performs a cleaning process for the substrate W. The process chamber 260 may have a different structure depending on a type of cleaning process to be performed. Unlike this, the respective process chambers 260 may have the same structure. Optionally, the process chambers 260 are divided into a plurality of groups, and the process chambers 260 included in the same group are the same as each other and the structures of the process chambers 260 included in different groups may be provided to be different from each other.

Figure 2:
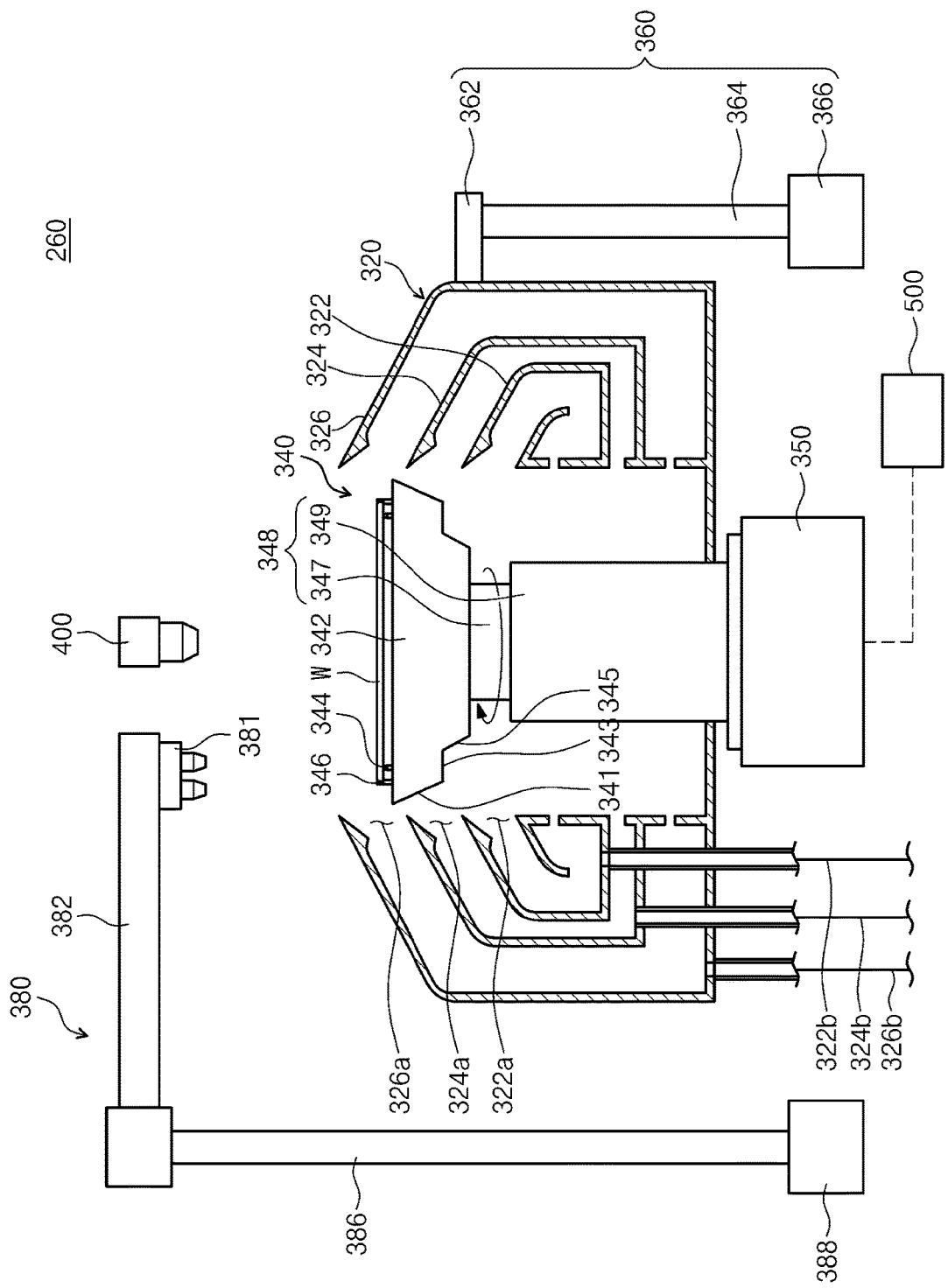
FIG. 2 is a diagram illustrating an example of a process chamber.

FIG. 2 is a diagram illustrating an example of the process chamber.

Referring to FIG. 2, the process chamber 260 includes a cup 320, a support member 340, an elevating unit 360, a treating liquid supply unit 380, a DIW supply unit 400, and a controller 500.

The cup 320 is provided with a treating process in which the substrate W is treated therein. The cup 320 has a cylindrical shape with an opened upper portion. The cup 320 has an inner recovery tank 322, an intermediate recovery tank, and an outer recovery tank 326. The respective recovery tanks 322, 324, and 326 recover different treating liquids among the treating liquids used in the process. The inner recovery tank 322 is provided in an annular ring shape of covering the support member 340. The intermediate recovery tank 324 is provided in an annular ring shape of covering the inner recovery tank 322. The outer recovery tank 326 is provided in an annular ring shape of covering the intermediate recovery tank 324. An inner space 322a of the inner recovery tank 322, a space 324a between the inner recovery tank 322 and the intermediate recovery tank 324, and a space 326a between the intermediate recovery tank 324 and the outer recovery tank 326 function as inlets through which the treating liquids are introduced to the inner recovery tank 322, the intermediate recovery tank 324, and the outer recovery tank 326, respectively. According to an exemplary embodiment, each inlet may be positioned at a different height. Recovery pipes 322b, 324b, and 326b are connected below the lower surfaces of the respective recovery tanks 322, 324, and 326. The treating liquids introduced to the respective recovery tanks 322, 324, and 326 may be provided to an external treating liquid recycling system (not illustrated) through the recovery pipes 322b, 324b, and 326b and reused.

The support member 340 supports the substrate W during the process and rotates the substrate W. The support member 340 has a spin chuck 342, a support pin 344, a chuck pin 346, and a support shaft 348. The spin chuck 342 has an upper surface provided in a substantially circular shape when viewed from the top. The outer surface of the spin chuck 342 is provided to be stepped. The spin chuck 342 is provided so that the lower surface thereof has a smaller diameter than the upper surface thereof. The outer surface of the spin chain 342 has a first inclined surface 341, a horizontal surface 343, and a second inclined surface 345. The first inclined surface 341 extends downward from the upper surface of the spin chuck 342. The horizontal surface 343 extends inward from the lower end of the first inclined surface 341. The second inclined surface 345 extends downward from the inner end of the horizontal surface 343. Each of the first inclined surface 341 and the second inclined surface 345 is provided toward a downward-inclined direction when being closer to the central axis of the body.

A plurality of support pins 344 is provided. The support pins 344 are disposed to be spaced apart from each other at predetermined intervals on the edge portion of the upper surface of the spin chuck 342 and protrude upward from the spin chuck 342. The support pins 344 are disposed to have the entirely annular ring shape by combinations with each other. The support pins 344 support a rear edge of the substrate W so that the substrate W is spaced apart from the upper surface of the spin chuck 342 at a predetermined distance.

A plurality of chuck pins 346 is provided. The chuck pin 346 is disposed farther away from the central axis of the spin chuck 342 than the support pin 344. The chuck pins 346 are provided to protrude upward from the spin chuck 342. The chuck pins 346 support the side portion of the substrate W so that the substrate W does not deviate from the regular position in a lateral direction when the support member 340 is rotated. The chuck pins 346 are provided to be linearly movable between a standby position and a support position along a radial direction of the spin chuck 342. The standby position is a position farther away from the center of the spin chuck 342 than the support position. When the substrate W is loaded or unloaded on the support member 340, the chuck pins 346 are located at the standby position, and when the process is performed on the substrate W, the chuck pins 346 are located at the support position. In the support position, the chuck pins 346 are in contact with the side portion of the substrate W.

The support shaft 348 rotatably supports the spin chuck 342. The support shaft 348 is positioned below the spin chuck 342. The support shaft 348 includes a rotary shaft 347 and a fixing shaft 349. The rotary shaft 347 is provided as an inner axis, and the fixing shaft 349 is provided as an outer axis. The rotary shaft 347 is provided so that the longitudinal direction thereof faces the third direction. The rotary shaft 347 is fixed and coupled onto the lower surface of the spin chuck 342. The rotary shaft 347 is provided to be rotatable by a driving member 350. The spin chuck 342 is provided to rotate together with the rotary shaft 347. The fixing shaft 349 has a hollow cylindrical shape of covering the rotary shaft 347. The fixing shaft 349 is provided to have a larger diameter than the rotary shaft 347. The inner surface of the fixing shaft 349 is positioned to be spaced apart from the rotary shaft 347. The fixing shaft 349 maintains a fixed state while the rotary shaft is rotated.

The elevating unit 360 moves the cup 320 in a vertical direction. As the cup 320 is moved vertically, the relative height of the cup 320 to the support member 340 is changed. The elevating unit 360 has a bracket 362, a moving shaft 364, and a driver 366. The bracket 362 is provided on the outer wall of the cup 320, and the bracket 362 is coupled to the moving shaft 364 to be moved in the vertical direction by the driver 366. The cup 320 is lowered so that the support member 340 protrudes to the upper portion of the cup 320 when the substrate W is placed on the support member 340 or lifted from the support member 340. Further, when the process is performed, the height of the cup 320 is adjusted so that the treating liquid may be introduced into the predetermined recovery tanks 322, 324, and 326 according to a type of treating liquid supplied to the substrate W. Optionally, the elevating unit 360 may move the support member 340 in the vertical direction.

The treating liquid supply unit 380 supplies a treating liquid onto the substrate W. The treating liquid supply unit 380 may supply the treating liquid heated at a predetermined temperature to the substrate W in order to increase the treating efficiency of the substrate W.

The treating liquid supply unit 380 includes a support shaft 386, an arm 382, and a treating liquid nozzle 381. The support shaft 386 is disposed on one side of the cup 320. The support shaft 386 has a rod shape so that the longitudinal direction thereof is provided in a vertical direction. The support shaft 386 can be rotated and elevated by a driving member 394. Unlike this, the support shaft 386 may be moved linearly and elevated in a horizontal direction by the driving member 394. The arm 382 supports the treating liquid nozzle 381. The arm 382 is coupled to the support shaft 386 and the treating liquid nozzle 381 is fixed and coupled to the lower surface of the end thereof. The treating liquid nozzle 381 may swing by the rotation of the support shaft 386. The treating liquid nozzle 381 is movable to a process position and a standby position by the rotation of the support shaft 386. Here, the process position is a position where the treating liquid nozzle 381 faces the support member 340, and the standby position is a position where the treating liquid nozzle 381 is out of the process position. The treating liquid nozzle 381 selectively supplies a first treating liquid and a second treating liquid onto the substrate W. According to the exemplary embodiment, the first treating liquid is a mixed liquid of phosphoric acid ($H_3PO_4$) and silicon (Si). According to the exemplary embodiment, the second treating liquid is pure phosphoric acid. The pure phosphoric acid defined herein refers to a phosphoric acid aqueous solution to which anything is not added. According to the exemplary embodiment, the pure phosphoric acid may be a phosphoric acid aqueous solution containing 90% phosphoric acid.

The DIW supply unit 400 supplies deionized water (DIW) onto the substrate W located in the support member 340. For example, the DIW supply unit 400 may be provided to be movable between the process position and the standby position by the same or similar structure as or to the treating liquid supply unit 380. A nozzle provided in the DIW supply unit 400 is located above the cup 320 and may be provided to supply the deionized water onto the substrate.

Figure 3:
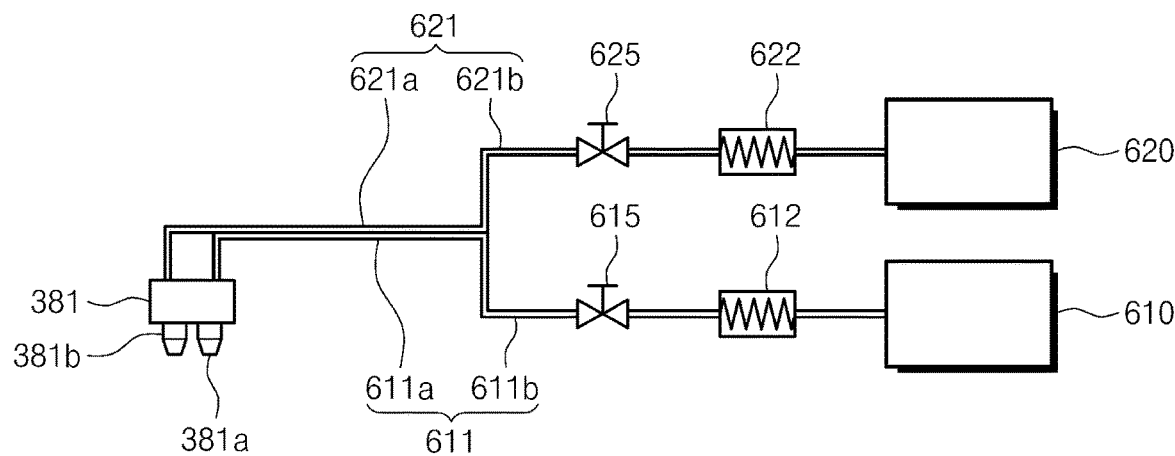
FIG. 3 is a diagram illustrating a treating liquid nozzle and a connection relationship in which the treating liquid nozzle is connected to a first treating liquid tank and a second treating liquid tank according to an exemplary embodiment of the present invention.

FIG. 3 is a diagram illustrating a treating liquid nozzle and a connection relationship in which the treating liquid nozzle is connected to a first treating liquid tank and a second treating liquid tank according to an exemplary embodiment of the present invention.

Referring to FIG. 3, the treating liquid nozzle 381 includes a first nozzle portion 381a and a second nozzle portion 381b. The first nozzle portion 381a and the second nozzle portion 381b are connected to one body to form the treating liquid nozzle 381. The first nozzle portion 381a supplies a first treating liquid onto the substrate W, and the second nozzle portion 381b supplies a second treating liquid to the substrate W. According to the exemplary embodiment, the first treating liquid is a mixed liquid of phosphoric acid ($H_3PO_4$) and silicon (Si). According to the exemplary embodiment, the second treating liquid is pure phosphoric acid. The pure phosphoric acid defined herein refers to a phosphoric acid aqueous solution to which anything is not added. According to the exemplary embodiment, the pure phosphoric acid may be a phosphoric acid aqueous solution containing 90% phosphoric acid.

The treating liquid nozzle 381 is connected to a first treating liquid tank 610 and a second treating liquid tank 620. The first treating liquid tank 610 is provided to store the first treating liquid at a predetermined concentration. The second treating liquid tank 620 is provided to store the second treating liquid at a predetermined concentration.

The first treating liquid tank 610 is connected to the first nozzle portion 381a by a first liquid supply pipe 611. The first liquid supply pipe 611 includes a first upstream pipe 611b and a first downstream pipe 611a. According to the flow of the first treating liquid supplied to the first nozzle portion 381a from the first treating liquid tank 610, on the first liquid supply pipe 611, the first upstream pipe 611b is disposed upstream and the first downstream pipe 611a is disposed downstream. One end of the first upstream pipe 611b is connected to the first treating liquid tank 610 and the other end thereof is connected to the first downstream pipe 611a. One end of the first downstream pipe 611a is connected to the first upstream pipe 611b and the other end thereof is connected to the first nozzle portion 381a. According to the exemplary embodiment, a first heater 612 and a first valve 615 are provided in the first upstream pipe 611b. The first heater 612 heats the first treating liquid at a predetermined temperature. The predetermined temperature may be 160° C. or higher. The first valve 615 may be provided as an opening/closing valve capable of opening and closing a flow channel. Further, the first valve 615 may be a flow control valve for controlling the opening of the flow channel to control the flow rate. The first downstream pipe 611a is in contact with the second downstream pipe 621a to be described below. The first downstream pipe 611a and the second downstream pipe 621a are in contact to a pathway connected to the treating liquid nozzle 381. As the first downstream pipe 611a and the second downstream pipe 621a are connected to the treating liquid nozzle 381 while being in contact with each other, the temperature of the treating liquid transmitted through each of the pipes may be complemented with each other.

The second treating liquid tank 620 is connected to the second nozzle portion 381b by a second liquid supply pipe 621. The second liquid supply pipe 621 includes a second upstream pipe 621b and a second downstream pipe 621a. According to the flow of the second treating liquid supplied to the second nozzle portion 381b from the second treating liquid tank 620, on the second liquid supply pipe 621, the second upstream pipe 621b is disposed upstream and the second downstream pipe 621a is disposed downstream. One end of the second upstream pipe 621b is connected to the first treating liquid tank 610 and the other end thereof is connected to the second downstream pipe 621a. One end of the second downstream pipe 621a is connected to the second upstream pipe 621b and the other end thereof is connected to the second nozzle portion 381b. According to the exemplary embodiment, a second heater 622 and a second valve 625 are provided in the second upstream pipe 621b. The second heater 622 heats the second treating liquid at a predetermined temperature. The predetermined temperature may be 160° C. or higher. The second valve 625 may be provided as an opening/closing valve capable of opening and closing a flow channel. Further, the second valve 625 may be a flow control valve for controlling the opening of the flow channel to control the flow rate. The second downstream pipe 621a is in contact with the first downstream pipe 611a. The second downstream pipe 621a and the first downstream pipe 611a are in contact to a pathway connected to the treating liquid nozzle 381. As the first downstream pipe 611a and the second downstream pipe 621a are connected to the treating liquid nozzle 381 while being in contact with each other, the temperature of the treating liquid transmitted through each of the pipes may be complemented with each other.

Figure 4:
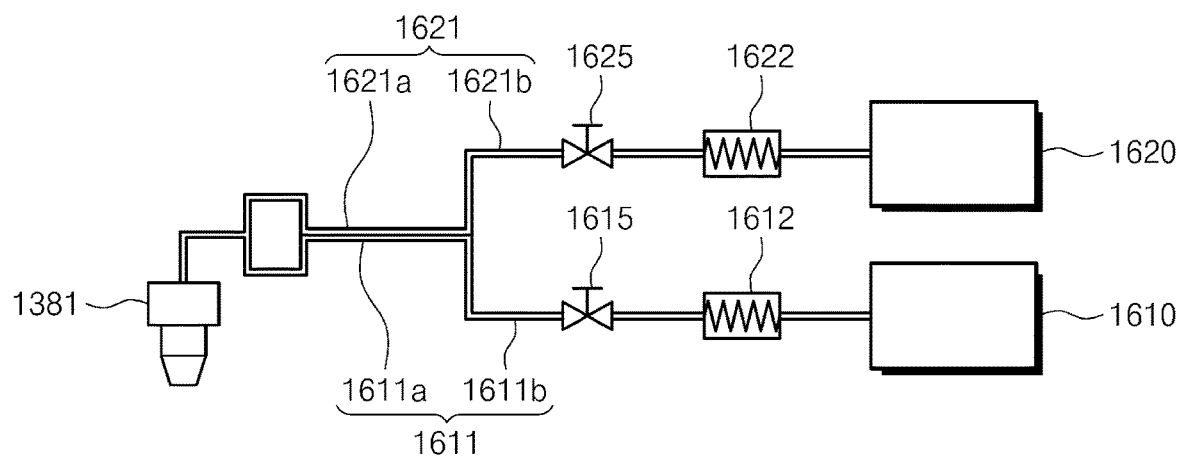
FIG. 4 is a diagram illustrating a treating liquid nozzle and a connection relationship in which the treating liquid nozzle is connected to a first treating liquid tank and a second treating liquid tank according to another exemplary embodiment of the present invention.

FIG. 4 is a diagram illustrating a treating liquid nozzle and a connection relationship in which the treating liquid nozzle is connected to a first treating liquid tank and a second treating liquid tank according to another exemplary embodiment of the present invention.

Referring to FIG. 4, a treating liquid nozzle 1381 is connected to a first treating liquid tank 1610 and a second treating liquid tank 1620. The first treating liquid tank 1610 is provided to store a first treating liquid at a predetermined concentration. The second treating liquid tank 1620 is provided to store a second treating liquid at a predetermined concentration.

The first treating liquid tank 1610 is connected to the treating liquid nozzle 1381 by a first liquid supply pipe 1611. The first liquid supply pipe 1611 includes a first upstream pipe 1611b and a first downstream pipe 1611a. According to the flow of the first treating liquid supplied to the treating liquid nozzle 1381 from the first treating liquid tank 1610, on the first liquid supply pipe 1611, the first upstream pipe 1611b is disposed upstream and the first downstream pipe 1611a is disposed downstream. One end of the first upstream pipe 1611b is connected to the first treating liquid tank 1610 and the other end thereof is connected to the first downstream pipe 1611a. One end of the first downstream pipe 1611a is connected to the first upstream pipe 1611b and the other end thereof is connected to the treating liquid nozzle 1381. According to the exemplary embodiment, a first heater 1612 and a first valve 1615 are provided in the first upstream pipe 1611b. The first heater 1612 heats the first treating liquid at a predetermined temperature. The predetermined temperature may be 160° C. or higher. In addition, the predetermined temperature may be below the boiling point of the first treating liquid. The first valve 1615 may be provided as an opening/closing valve capable of opening and closing a flow channel. Further, the first valve 1615 may be a flow control valve for controlling the opening of the flow channel to control the flow rate. The first downstream pipe 1611a is in contact with a second downstream pipe 1621a to be described below. The first downstream pipe 1641a and the second downstream pipe 1621a are in contact to a pathway connected to the treating liquid nozzle 1381. As the first downstream pipe 1611a and the second downstream pipe 1621a are connected to the treating liquid nozzle 1381 while being in contact with each other, the temperature of the treating liquid transmitted through each of the pipes may be complemented with each other.

The second treating liquid tank 1620 is connected to the treating liquid nozzle 1381 by a second liquid supply pipe 1621. The second liquid supply pipe 1621 includes a second upstream pipe 1621b and a second downstream pipe 1621a. According to the flow of the second treating liquid supplied to the treating liquid nozzle 1381 from the second treating liquid tank 1620, on the second liquid supply pipe 1621, the second upstream pipe 1621b is disposed upstream and the second downstream pipe 1621a is disposed downstream. One end of the second upstream pipe 1621b is connected to the first treating liquid tank 1610 and the other end thereof is connected to the second downstream pipe 1621a. One end of the second downstream pipe 1621a is connected to the second upstream pipe 1621b and the other end thereof is connected to the treating liquid nozzle 1381. According to the exemplary embodiment, a second heater 1622 and a second valve 1625 are provided in the second upstream pipe 1621b. The second heater 1622 heats the second treating liquid at a predetermined temperature. The predetermined temperature may be 160° C. or higher. In addition, the predetermined temperature may be below the boiling point of the first treating liquid. The second valve 1625 may be provided as an opening/closing valve capable of opening and closing a flow channel. Further, the second valve 1625 may be a flow control valve for controlling the opening of the flow channel to control the flow rate. The second downstream pipe 1621a is in contact with the first downstream pipe 1611a. The second downstream pipe 1621a and the first downstream pipe 1611a are in contact to a pathway connected to the treating liquid nozzle 1381. As the first downstream pipe 1611a and the second downstream pipe 1621a are connected to the treating liquid nozzle 1381 while being in contact with each other, the temperature of the treating liquid transmitted through each of the pipes may be complemented with each other.

According to the exemplary embodiments illustrated and described in FIGS. 3 and 4, the treating liquid can be ejected from one treating liquid nozzle supplied from each of the first treating liquid supply tank and the second treating liquid supply tank, thereby solving the interference between the nozzles caused by providing the plurality of nozzles and attaching the first treating liquid supply pipe and the second treating liquid supply pipe to complement the temperature therebetween.

FIG. 5 is a diagram illustrating a process of treating a substrate according to an exemplary embodiment of the present invention. A method for treating a substrate according to an exemplary embodiment of the present invention will be described with reference to FIG. 5.

A pre-wet process may be performed before an etching process on a substrate (S100). The pre-wet process may be performed by supplying deionized water (DIW) to the substrate by the DIW supply unit 400. When the deionized water (DIW) is supplied, the controller 500 may control the support member 340 so that the substrate is rotated at a predetermined speed.

The etching process is performed by to a treating process (S200) by a first treating liquid and a treating process (S300) by a second treating liquid. The substrate W is provided in a state in which a silicon nitride layer and a silicon oxide layer are formed. For example, the substrate is provided in a process of manufacturing a V-nand memory, and may be provided in the state where the silicon nitride layers and the silicon oxide layers are alternately stacked with each other. The silicon nitride layer is selectively etched by the etching process.

In the treating process (S200) by the first treating liquid, the first treating liquid is supplied onto the substrate W while the support member 340 supporting the substrate W is rotated. The first treating liquid is supplied at a high temperature (e.g., 160° C. or higher). The treating liquid nozzle 381 supplies the first treating liquid onto the substrate W in a fixing or scanning manner. The first treating liquid is a mixed liquid of phosphoric acid ($H_3PO_4$) and silicon (Si).

In the treating process (S300) by the second treating liquid, the second treating liquid is supplied at a high temperature (e.g., 160° C. or higher) and the treating liquid nozzle 381 supplies the second treating liquid onto the substrate W in a fixing or scanning manner. The second treating liquid is pure phosphoric acid. At this time, the supply flow rate of the second treatment liquid is 100 to 1500 cc/min, and the support member 340 is rotated at 10 to 1500 rpm.

According to the exemplary embodiment of the present invention, as the nozzle supplying the first treating liquid and the nozzle supplying the second treating liquid are provided to the treating liquid nozzle 381, in the process S300, a process S400 may be immediately performed. In addition, according to the exemplary embodiment of the present invention, after the substrate W is treated with the first treating liquid provided with the mixed liquid of phosphoric acid and silicon (Si), the substrate W may be rinsed with the second treating liquid provided with pure phosphoric acid other than the deionized water (DIW). The pure phosphoric acid provided as the second treating liquid breaks bonds of by-products formed by the reaction of silicon (Si) of the first treating liquid provided with the mixed liquid of phosphoric acid and silicon (Si) with oxygen (O) of the substrate W to remove particles. Accordingly, according to the exemplary embodiment of the present invention, the use of an SC-1 chemical liquid is unnecessary. That is, an additional cleaning process is unnecessary.

When the etching process on the substrate is completed, a rinse process may be performed (S400). The rinse process may be performed by supplying deionized water to the substrate by the DIW nozzle 400. When the deionized water is supplied, the controller 500 may control the support member 340 so that the substrate is rotated at a predetermined speed. Thereafter, the drying process (S500) may be performed in the substrate W. The drying process may be applied with spin dry, supercritical dry, or the like.

The controller 500 may control the substrate treating apparatus. The controller 500 may control the components of the process chamber 260 so as to process the substrate according to a setting process as described above. In addition, the controller 500 may include a process controller consisting of a microprocessor (computer) for executing a control of the substrate treating apparatus, a user interface consisting of a keyboard for performing a command input operation and the like to manage the substrate treating apparatus by an operator, a display for visualizing and displaying an moving situation of the substrate treating apparatus, and the like, and a storage unit for storing control programs for executing the processing executed in the substrate treating apparatus by the control of the process controller and programs, that is, treating recipes for executing the processing in each configuration unit according to various data or treating conditions. In addition, the user interface and the storage unit may be connected to the process controller. The treating recipes may be stored in a storage medium in the storage unit, and the storage medium may be a hard disk, and a transportable disk such as a CD-ROM, a DVD, and the like or a semiconductor memory such as a flash memory and the like.

As the exemplary embodiment of the present invention, the single wafer type device has been described, but the substrate treating method according to the exemplary embodiment of the present invention may be applied even to a batch type device. For example, a plurality of substrates may be immersed and treated in a water tank in which the treating liquid is received. In the exemplary embodiment, the substrate treating method is performed by sequentially performing a step of immersing and pre-wetting the substrate in the water tank in which deionized water (DIW) is received, a step of immersing and etching the substrate in a water tank in which a first treating liquid is received, a step of immersing and rinsing the substrate in a water tank in which a second treating liquid is received, and a step of immersing and rinsing the substrate in a water tank in which deionized water (DIW) is received. The first treating liquid is a mixed liquid of phosphoric acid and silicon heated at a high temperature (e.g., 160° C. or higher). The first treating liquid is pure phosphoric acid heated at a high temperature (e.g., 160° C. or higher). Then, the drying process is performed on the substrate rinsed by deionized water. The drying process may be applied with spin dry, supercritical dry, or the like.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate comprising:
   a spin chuck configured to support a substrate and provided rotatably;
   a treating liquid nozzle configured to supply selectively a heated temperature first treating liquid and a heated temperature second treating liquid onto the substrate; and
   a controller configured to control the treating liquid nozzle so that the treating liquid nozzle first supplies the first treating liquid onto the substrate and then supplies the second treating liquid onto the substrate,
   a first treating liquid tank configured to store the first treating liquid;
   a second treating liquid tank configured to store the second treating liquid;
   a first liquid supply pipe configured to transfer the first treating liquid stored in the first treating liquid tank to the treating liquid nozzle by connecting the first treating liquid tank and the treating liquid nozzle; and
   a second liquid supply pipe configured to transfer the second treating liquid stored in the second treating liquid tank to the treating liquid nozzle by connecting the second treating liquid tank and the treating liquid nozzle,
   wherein the first liquid supply pipe and the second liquid supply pipe are provided so that one region or more are in contact with each other.

2. The apparatus for treating the substrate of claim 1, wherein the substrate is provided in a state where a silicon nitride layer and a silicon oxide layer are formed.

3. The apparatus for treating the substrate of claim 1, wherein the first treating liquid is provided as a mixed liquid of phosphoric acid and silicon.

4. The apparatus for treating the substrate of claim 1, wherein the second treating liquid is provided as pure phosphoric acid.

5. The apparatus for treating the substrate of claim 1,
wherein the first liquid supply pipe and the second liquid supply pipe are provided so as to be in contact with the treating liquid nozzle at one point.

6. The apparatus for treating the substrate of claim 1,
wherein the first liquid supply pipe comprises
a first upstream pipe disposed upstream and connected with the first treating liquid tank and a first downstream pipe disposed downstream and connected with the treating liquid nozzle, based on flow of the first treating liquid supplied to the treating liquid nozzle from the first treating liquid tank, and
wherein the second liquid supply pipe comprises
a second upstream pipe disposed upstream and connected with the second treating liquid tank and a second downstream pipe disposed downstream and connected with the treating liquid nozzle, based on flow of the second treating liquid supplied to the treating liquid nozzle from the second treating liquid tank,
wherein the first downstream pipe and the second downstream pipe are provided to be in contact with each other.

7. The apparatus for treating the substrate of claim 6,
wherein the first upstream pipe is provided with a first heater and a valve, and
wherein the second upstream pipe is provided with a second heater and a valve.

8. The apparatus for treating the substrate of claim 7,
wherein the first heater heats the first treating liquid at a first temperature, and
wherein the second heater heats the second treating liquid at a second temperature.

9. The apparatus for treating the substrate of claim 7,
wherein the first heater heats the first treating liquid at 160° C. or higher, and
wherein the second heater heats the second treating liquid at 160° C. or higher.

10. The apparatus for treating the substrate of claim 6,
wherein the treating liquid nozzle comprises a first nozzle portion and a second nozzle portion,
wherein the first nozzle portion is connected with the first liquid supply pipe, and
wherein the second nozzle portion is connected with the second liquid supply pipe.

11. The apparatus for treating the substrate of claim 1, further comprising:
a DIW nozzle configured to supply deionized water onto the substrate.

12. The apparatus for treating the substrate of claim 11,
wherein the controller controls
a pre-wet process of supplying the deionized water onto the substrate for a predetermined time while the substrate is rotated; and
an etching process of supplying sequentially the first treating liquid and the second treating liquid onto the substrate while the substrate is rotated to be performed after the pre-wet process.

13. The apparatus for treating the substrate of claim 12,
wherein the controller controls a rinse process of supplying the deionized water onto the substrate to be performed after the etching process.

14. An apparatus for treating a substrate comprising:
a spin chuck configured to support a substrate and provided rotatably;
a treating liquid nozzle configured to supply selectively a heated temperature first treating liquid and a heated temperature second treating liquid onto the substrate;
a first treating liquid tank configured to store a mixed liquid of phosphoric acid and silicon as the first treating liquid;
a second treating liquid tank configured to store pure phosphoric acid as the second treating liquid;
a first liquid supply pipe configured to transfer the first treating liquid stored in the first treating liquid tank to the treating liquid nozzle by connecting the first treating liquid tank and the treating liquid nozzle; and
a second liquid supply pipe configured to transfer the second treating liquid stored in the second treating liquid tank to the treating liquid nozzle by connecting the second treating liquid tank and the treating liquid nozzle,
wherein the first liquid supply pipe comprises:
a first upstream pipe disposed upstream, connected with the first treating liquid tank, and provided with a first heater and a valve, and a first downstream pipe disposed downstream and connected with the treating liquid nozzle, based on flow of the first treating liquid supplied to the treating liquid nozzle from the first treating liquid tank,
wherein the second liquid supply pipe comprises
a second upstream pipe disposed upstream, connected with the second treating liquid tank, and provided with a second heater and a valve and a second downstream pipe disposed downstream and connected with the treating liquid nozzle, based on the flow of the second treating liquid supplied to the treating liquid nozzle from the second treating liquid tank,
wherein the first downstream pipe and the second downstream pipe are provided to be in contact with each other,
comprising: a controller configured to control the treating liquid nozzle so that the treating liquid nozzle first supplies the first treating liquid onto the substrate and then supplies the second treating liquid onto the substrate,
wherein the substrate is provided in a state where a silicon nitride layer and a silicon oxide layer are formed.

* * * * *